United States Patent
Hsu et al.

(10) Patent No.: US 7,893,444 B2
(45) Date of Patent: Feb. 22, 2011

(54) LIGHT EMITTING DIODE AND LIGHT SOURCE MODULE HAVING SAME

(75) Inventors: Hung-Kuang Hsu, Miao-Li Hsien (TW); Chun-Wei Wang, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 285 days.

(21) Appl. No.: 12/327,528

(22) Filed: Dec. 3, 2008

(65) Prior Publication Data

US 2009/0219719 A1 Sep. 3, 2009

(30) Foreign Application Priority Data

Feb. 29, 2008 (CN) .................. 2008 1 0300431

(51) Int. Cl.
*H01L 27/15* (2006.01)
*H01L 29/26* (2006.01)
*H01L 31/12* (2006.01)
*H01L 33/00* (2006.01)

(52) U.S. Cl. ........... 257/79; 257/E33.075; 257/E33.001

(58) Field of Classification Search .................. 257/79, 257/82, 88, 99, E33.001, E33.075, 918, 675, 257/678, 706, 718, 720, 796, E29.119, E23.101, 257/E23.103, E23.105
See application file for complete search history.

(56) References Cited

U.S. PATENT DOCUMENTS

| | | | |
|---|---|---|---|
| 7,709,856 B2 * | 5/2010 | Tsukagoshi | .................. 257/100 |
| 2005/0194603 A1 | 9/2005 | Slater et al. | |
| 2006/0198147 A1 | 9/2006 | Ge | |
| 2008/0099775 A1 | 5/2008 | Yu et al. | |
| 2009/0086492 A1 | 4/2009 | Meyer | |

FOREIGN PATENT DOCUMENTS

| CN | 200965887 Y | 10/2007 |
|---|---|---|
| WO | WO 2008108574 A1 | 9/2008 |

* cited by examiner

*Primary Examiner*—Davienne Monbleau
*Assistant Examiner*—Monica D Harrison
(74) *Attorney, Agent, or Firm*—Clifford O. Chi

(57) ABSTRACT

An exemplary light emitting diode includes a substrate, a LED chip, a first heat conductor, and a second heat conductor. The substrate comprises a first surface and an opposite second surface. The LED chip is positioned on the first surface of the substrate and it has a first electrode and a second electrode. The first heat conductor is attached to the second surface of the substrate and electrically connected to the first electrode of the LED chip. The second heat conductor is extending through the first heat conductor and insulated from the second heat conductor, and electrically connected to the second electrode of the LED chip.

15 Claims, 5 Drawing Sheets

LIGHT EMITTING DIODE AND LIGHT SOURCE MODULE HAVING SAME

BACKGROUND

1. Technical Field

The present invention relates to light emitting diodes with high heat-dissipation efficiency and light source modules having same.

2. Description of Related Art

A light emitting diode (LED) is one type of semiconductor light source, and the electrical and optical characteristics and life span thereof are greatly temperature-dependent. Generally, a high working temperature will cause a deterioration of an internal quantum efficiency of the LED and shorten the life span thereof. Furthermore, a resistance of a semiconductor has a negative temperature coefficient and tends to be reduced with an increase in the working temperature. Such a reduced resistance will correspondingly result in a larger current at a given voltage and the generation of excessive heat. If the excessive heat cannot be effectively dissipated, a phenomenon of heat accumulation will be difficult to avoid, and, accordingly, the deterioration of the LED can expect to be accelerated.

Referring to FIG. 5, a typical light emitting diode 100 includes a printed circuit board 101, a first electrode 102, a second electrode 103, a LED chip 104, and an encapsulant 105. The first electrode 102 and the second electrode 103 are parallelly positioned in the printed circuit board 101. The LED chip 104 is positioned on the first electrode 102 and wire bonded to the first electrode 102 and the second electrode 103. The encapsulant 105 is positioned on the printed circuit board 101 to package the LED chip 104. The excessive heat formed by the LED chip 104 is dissipated through the encapsulant 105 and the first electrode 102, but thermal conductivity of the encapsulant 105 and the first electrode 102 is not very well, such that the excessive heat cannot be effectively dissipated.

Therefore, what is needed is to provide a light emitting diode with high heat-dissipation efficiency and a light source module having same.

SUMMARY

A light emitting diode, in accordance with an exemplary embodiment, is provided. The light emitting diode includes a substrate, a LED chip, a first heat conductor, and a second heat conductor. The substrate has a first surface and an opposite second surface. The LED chip is positioned on the first surface of the substrate and includes a first electrode and a second electrode. The first heat conductor is attached to the second surface of the substrate and electrically connected to the first electrode of the LED chip. The second heat conductor is extending through the first heat conductor and insulated from the first heat conductor, and electrically connected to the second electrode of the LED chip.

Other advantages and novel features will become more apparent from the following detailed description of the present embodiments, when taken in conjunction with the accompanying drawings.

BRIEF DESCRIPTION OF THE DRAWINGS

Many aspects of the present light emitting diode and light source module can be better understood with reference to the following drawings. The components in the drawings are not necessarily drawn to scale, the emphasis instead being placed upon clearly illustrating the principles of the present light source module. Moreover, in the drawings, like reference numerals designate corresponding parts throughout the several views.

The exemplifications set out herein illustrate at least one exemplary embodiment, in one form, and such exemplifications are not to be construed as limiting the scope of the present light emitting diode and light source module in any manner.

DETAILED DESCRIPTION

Figure 1:
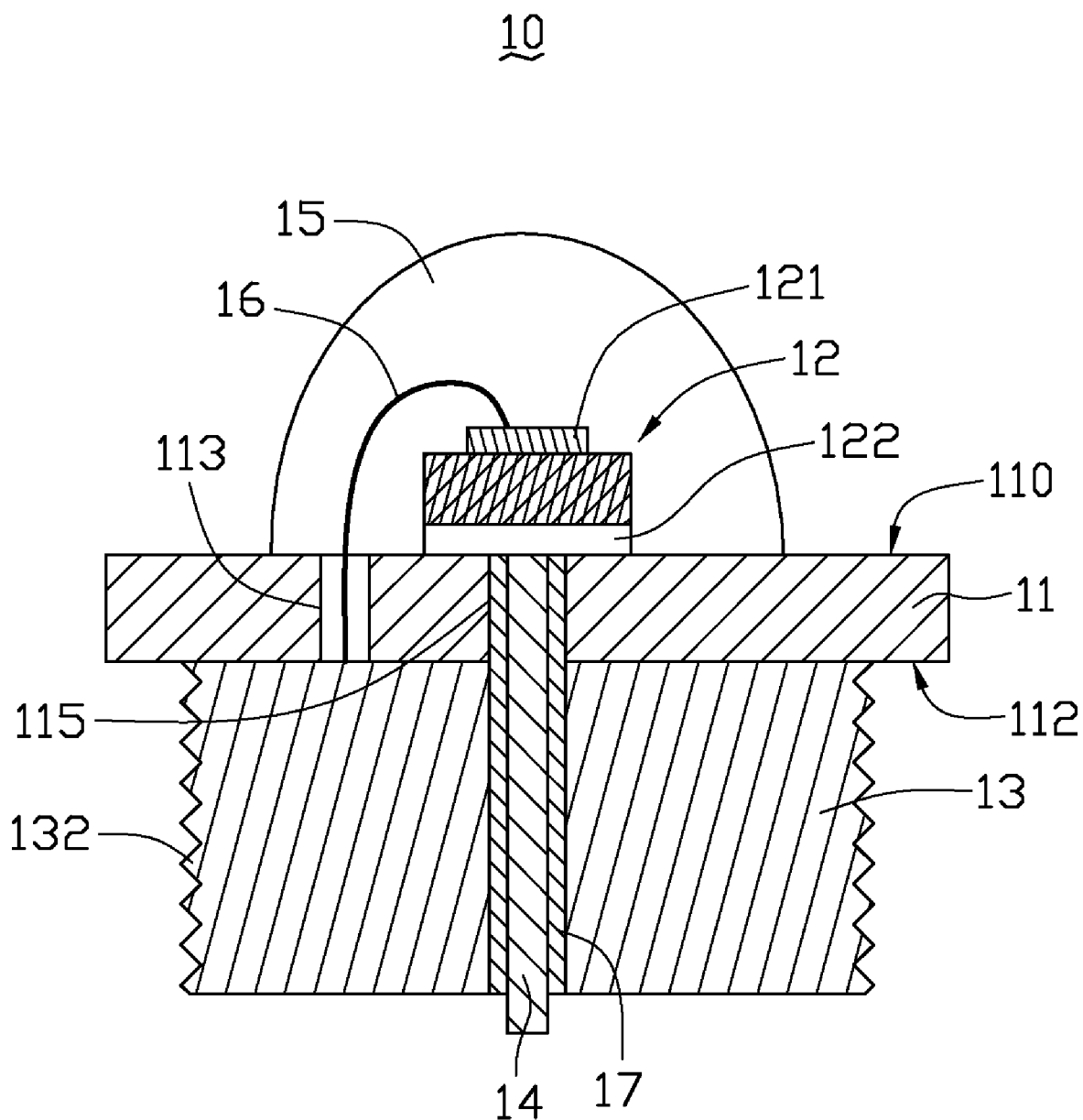
FIG. 1 is a schematic cross-sectional view of a light emitting diode, in accordance with a first embodiment.

Referring to FIG. 1, a light emitting diode 10, in accordance with an exemplary embodiment, is provided. The light emitting diode 10 includes a substrate 11, a LED chip 12, a conducting column 13, a conductive rod 14 and an encapsulant 15.

The substrate 11 has a first surface 110, a second surface 112 opposite to the first surface 110, a first through hole 113 and a second through hole 115 penetrating/extending through the first and the second surfaces 110, 112. A shape of the substrate 11 may be a quadrilateral, pentagon, hexagon, or other polygon. The substrate 11 may be an insulated substrate made of electric-insulated heat-conducted materials, such as glass fiber, ceramic materials etc. In addition, the substrate 11 may also be a metallic substrate. In present embodiment, the substrate 11 is an insulated substrate made of ceramic materials.

The LED chip 12 and encapsulant 15 are both positioned on the first surface 110 of the substrate 11. The encapsulant 15 seals the LED chip 12 to protect the LED chip 12 from mechanical damage, moisture, and atmospheric exposure. It also increases light extraction efficiency from the LED chip 12 relative to a LED chip in air.

The conducting column 13 is attached to the second surface 112 of the substrate 11, and the conductive rod 14 is extending through the conducting column 13 and substrate 11. One end of the conducting column 13 firmly contacts to the second surface 112. In the exemplary embodiment, the LED chip 12 has a top electrode 121 and a bottom electrode 122. The LED chip 12 includes a metal wire 16 extending through the first through hole 113 and interconnecting the top electrode 121 and the conducting column 13. The conductive rod 14 that passing through the second through hole 115 is in ohmic contact with the second electrode.

The conducting column 13 and the conductive rod 14 are used to cooperatively supply electrical power to the LED chip 12. The conducting column 13 is insulated from the conductive rod 14. In the exemplary embodiment, an insulation layer 17 is arranged between the conducting column 13 and the conductive rod 14. An end of the conductive rod 14 that connects the bottom electrode 122 of the LED chip 12 also has the insulation layer 17 coiled around thereon, thereby insulating the conductive rod 14 with the substrate 11. In addition, on outer surface of the conducting column 13 has outer threads 132 thereon, so that the light emitting diode 10 can be threadingly engaged with other device. It can be understood that, if the substrate 11 is a metallic substrate, an insulation layer (not shown) is needed between the bottom electrode 122 of the LED chip 12 and the first surface 110 of the substrate 11.

During the working state of the LED chip 12, heat from the LED chip 12 can be effectively dissipated by the substrate 11 and the conducting column 13 along a direction away from the LED chip 12. Thereby, heat-dissipation efficiency of the light emitting diode 10 can be improved.

Figure 2:
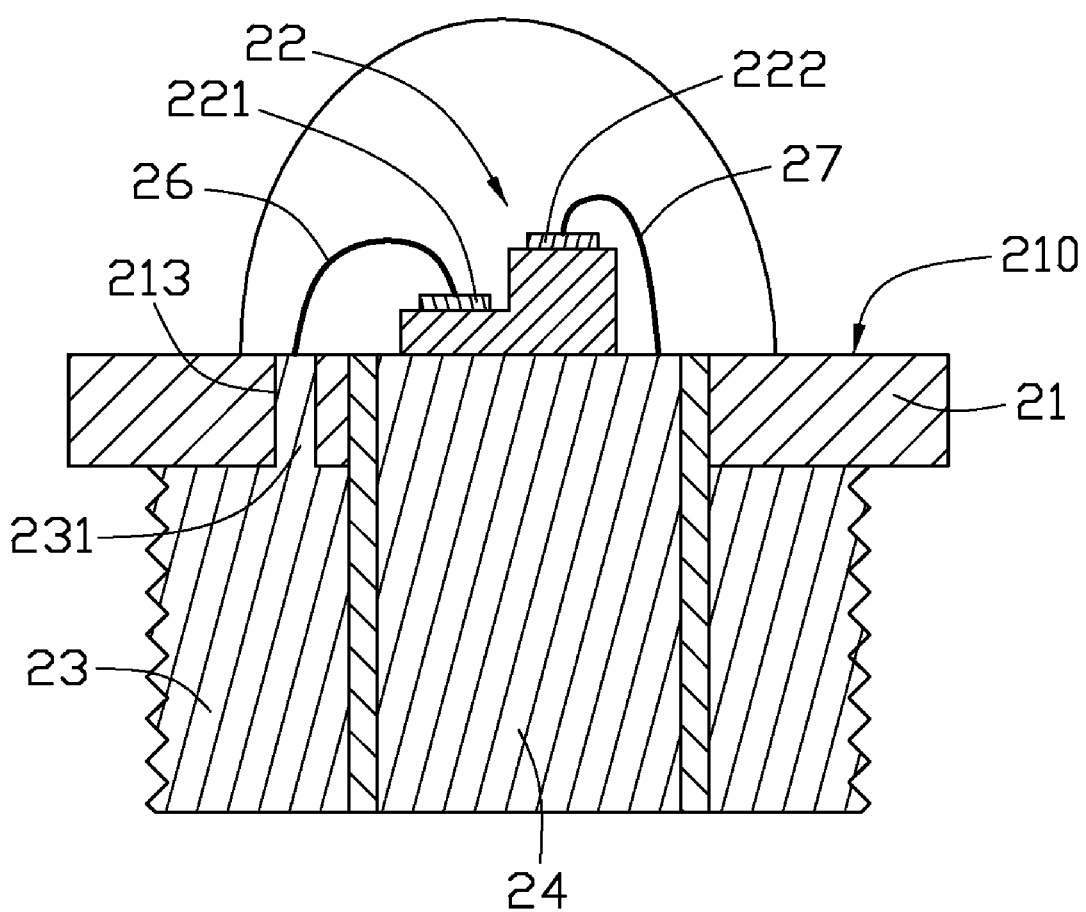
FIG. 2 is a schematic cross-sectional view of a light emitting diode, in accordance with a second embodiment.

Referring to FIG. 2, a light emitting diode 20, in accordance with a second embodiment, is provided. The light emitting diode 20 is similar to light emitting diode 10 of the first embodiment, and there has the following difference between them.

An anode 221 and a cathode 222 of the LED chip 22 are paralleled placed on the substrate 21. The conducting column 23 has a protrusion 231 inserted into the first through hole 213 of substrate 21, the protrusion 231 extends to first surface 210 of the substrate 21, and the anode 221 of the LED chip 22 is wire bonded to the protrusion 231 using a metal wire 27. Two metal wire 26, 27 are respectively interconnected the anode 221 and the cathode 222 to the protrusion 231 and the conductive rod 24.

In the exemplary embodiment, the conducting column 23 and the conductive rod 24 are used to cooperatively supply electrical power to the LED chip 22. When the LED chip 22 is lighting, heat from the LED chip 22 will be effectively dissipated by the substrate 21, the conducting column 23, and conductive rod 24 along a direction away from the LED chip 22. Thereby, heat-dissipation efficiency of the light emitting diode 20 can be improved.

Figure 3:
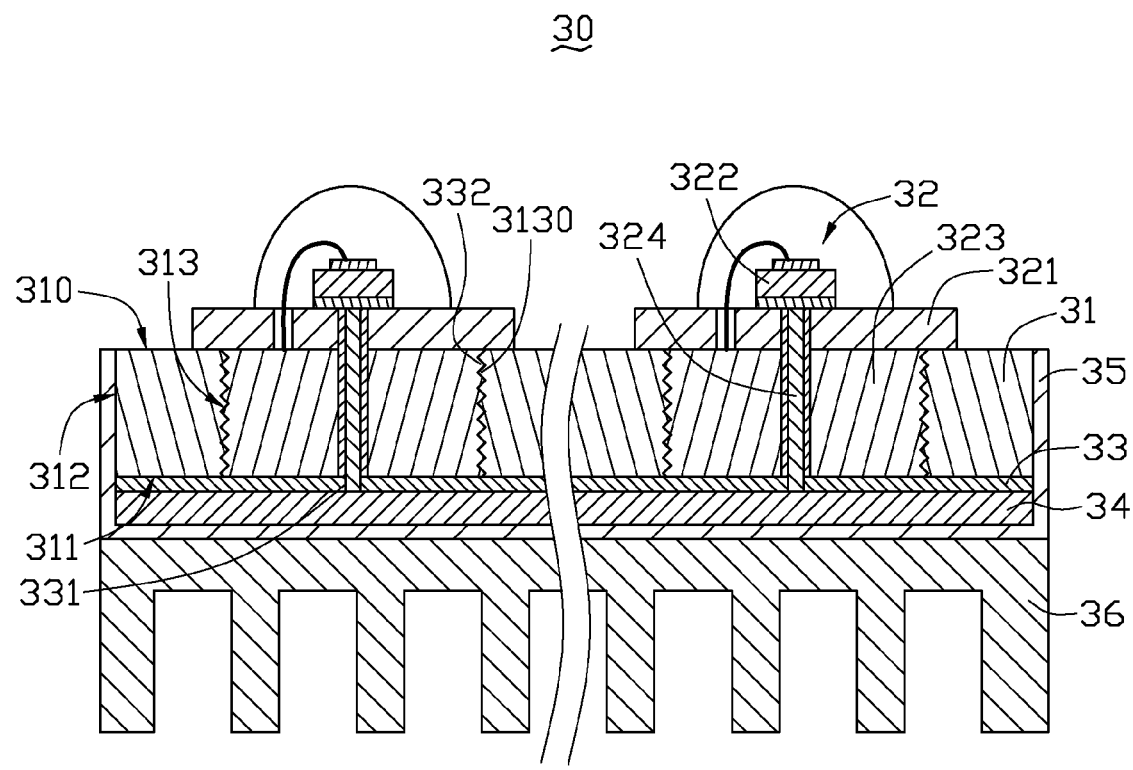
FIG. 3 is a schematic, part cross-sectional view of a light source module, in accordance with a third embodiment.

Referring to FIG. 3, a light source module 30, in accordance with a third embodiment, is provided. The light source module 30 includes a heat-dissipating plate 31, a number of light emitting diodes 32, an inner insulation layer 33, a conductive film 34, an outer insulation layer 35, and a number of heat dissipation fins 36.

The heat-dissipating plate 31 has a third surface 310, a fourth surface 311 opposite to the third surface 311, and a side surface 312 located between the third surface 310 and the fourth surface 311. A number of third through holes 313 are paralleled placed in the heat-dissipating plate 31, which penetrating/extending through the third and the fourth surfaces 310, 311. An inner wall of each third through holes 313 has inner threads 3130 which threadedly engaged in the outer threads 332 of the conducting column 323. Thus, the conducting columns 323 of the light emitting diodes 32 are threadedly engaged with heat-dissipating plate 31, thereby the light emitting diodes 32 can be respectively received in the third through holes 313.

The light emitting diode 32 can be the light emitting diode 10 of the first embodiment or the light emitting diode 20 of the second embodiment.

The inner insulation layer 33, the conductive film 34, and the outer insulation layer 35 are arranged on the fourth surface 311 of the heat-dissipating plate 31 in order written. The inner insulation layer 33 is adjacent to the fourth surface 311 of the heat-dissipating plate 31, and it has a number of fourth through holes 331 respectively corresponding to and communicated with the third through holes 313.

One end of conductive rod 324 of the light emitting diode 32 away from the substrate 321 is electrically connected to the conductive film 34 passing through the fourth through hole 31. The outer insulation layer 35 may be located one side of the conductive film 34 away from the inner insulation layer 33, or placed on the side surface 312 of the heat-dissipating plate 31. The heat dissipation fins 36 extend from the outer insulation layer 35 in a direction directed away from the conductive film 34 (advantageously, essentially orthogonal thereto).

In the exemplary embodiment, the heat-dissipating plate 31 and the conductive film 34 are used to cooperatively supply electrical power to the LED chip 32. When the LED chip 32 is lighting, heat from the LED chip 32 will be effectively dissipated by the substrate 321 and the conducting column 323 to the heat-dissipating plate 31. Because the heat-dissipating plate 31 has a large heat-dissipating area, it possible for the light source module 30 to achieve high heat-dissipation efficiency. The heat-dissipating plate 31 and the heat dissipation fins 166 generally are made from a material with high heat conductivity, such as aluminum (Al), copper (Cu), or an alloy thereof.

Figure 4:
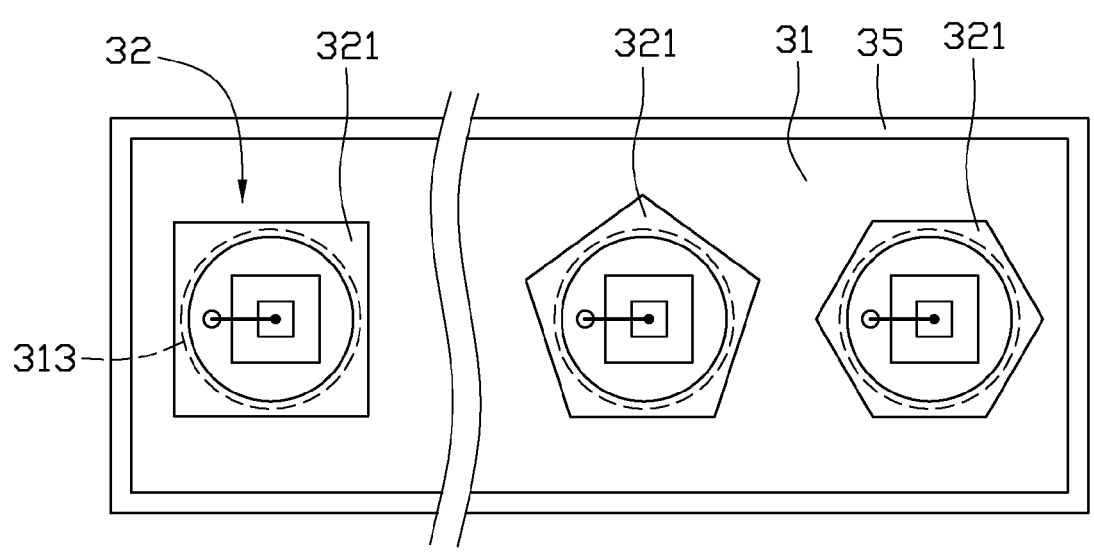
FIG. 4 is a schematic, part top plan view of a light source module in FIG. 3.
Figure 5:
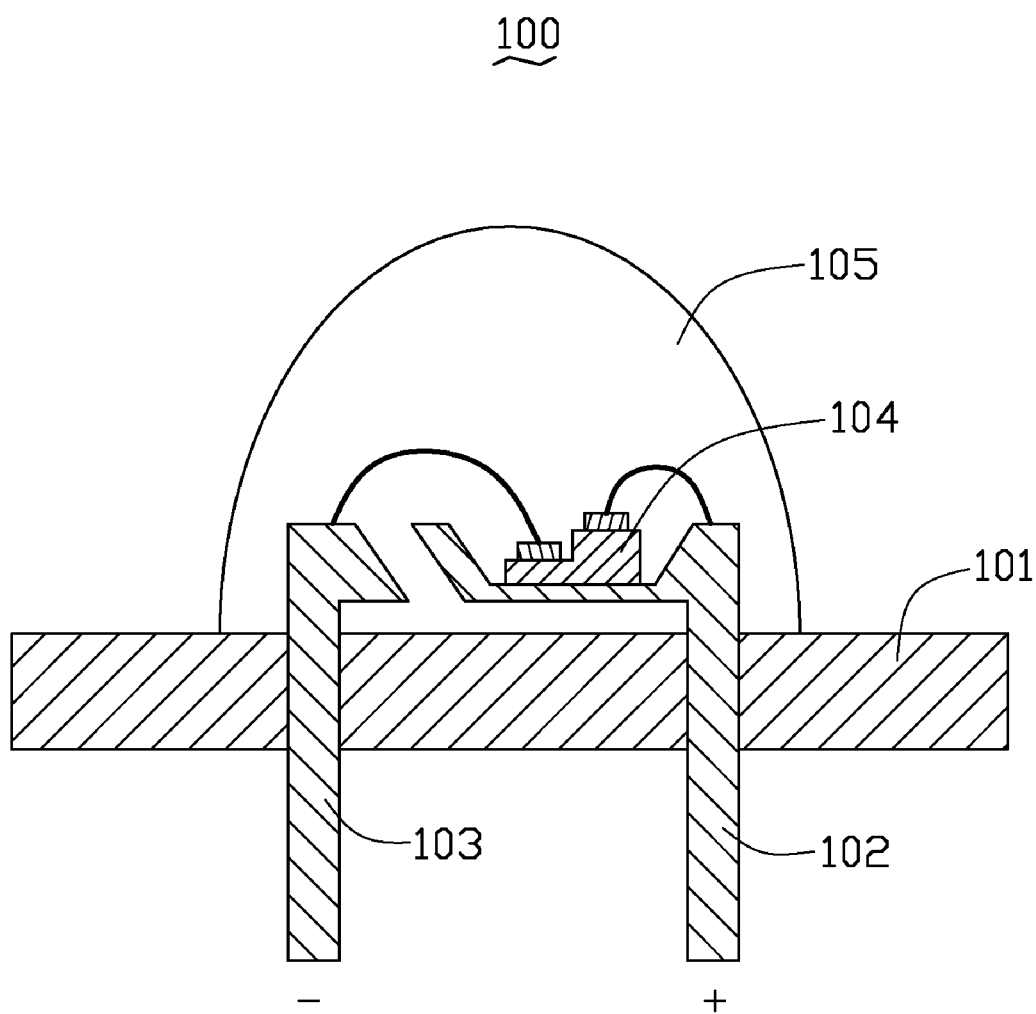
FIG. 5 is a schematic, cross-sectional view of a typical light emitting diode, in accordance with the related art.

Referring to FIG. 4, the shape of the substrates 321 each are, but not limited to be, quadrilateral-shaped, pentagon-shaped, hexagonal-shaped, it is advantageously chosen to apply torsional load to the substrates 321 of the light emitting diodes 32 by screwdriver or wrench, to rotate the conducting columns 323 of the light emitting diodes 32 into the third through holes 313.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the present invention.

What is claimed is:

1. A light emitting diode, comprising:
   a substrate including a first surface, a second surface opposite to the first surface;
   a LED chip being positioned on the first surface of the substrate and comprising a first electrode and a second electrode;
   a first heat conductor attached to the second surface of the substrate and electrically connected to the first electrode of the LED chip; and
   a second heat conductor extending through the first heat conductor and insulated from the first heat conductor, and electrically connected to the second electrode of the LED chip.

2. The light emitting diode of claim 1, further comprising an insulation layer between the first heat conductor and the second heat conductor.

3. The light emitting diode of claim 1, wherein the substrate includes a first through hole and a second through hole extending through the first and the second surfaces, the LED chip includes a metal wire extending through the first through hole and interconnecting the first electrode and the first heat conductor, the second heat conductor passing through the second through hole and being in ohmic contact with the second electrode.

4. The light emitting diode of claim 1, wherein the LED chip includes two metal wires respectively interconnecting the first electrode and the second electrode to the first heat conductor and the second heat conductor.

5. The light emitting diode of claim 1, wherein the first heat conductor has an outer thread formed thereon.

6. The light emitting diode of claim 1, wherein the substrate is polygon-shaped.

7. A light source module comprising:
at least one light emitting diode comprising
- a substrate including a first surface, a second surface opposite to the first surface;
- a LED chip placed on the first surface of the substrate, the LED chip having a first electrode and a second electrode,
- a first heat conductor placed on the second surface of the substrate and electrically connected to the first electrode of the LED chip, and
- a second heat conductor extending through the first heat conductor and insulated from the first heat conductor, and electrically connected to the second electrode of the LED chip; and a heat-dissipating plate member including a third surface, a fourth surface opposite to the third surface, a side surface located between the third surface and the fourth surface, and at least one third through hole extending through the third and the fourth surfaces, the at least one light emitting diode being received in the at least one third through hole.

8. The light emitting diode of claim 7, wherein the at least one light emitting diode is threadedly engaged in the at least one third through hole.

9. The light emitting diode of claim 7, further comprising an inner insulation layer, a conductive film, and an outer insulation layer being arranged on the fourth surface of the heat-dissipating plate in order written, wherein the inner insulation layer is adjacent to the fourth surface of the heat-dissipating plate, and the conductive film is electrically connected to the second heat conductor of the LED chip.

10. The light emitting diode of claim 7, further comprising a plurality of heat dissipation fins, the heat dissipation fins extending from the outer insulation layer in a direction directed away from the conductive film.

11. A light source module comprising:
a plurality of light emitting diodes each comprising
- a substrate including a first surface, and an opposing second surface;
- a LED chip mounted on the first surface of the substrate, the LED chip including a first electrode and a second electrode,
- a first metallic heat conductor attached on the second surface of the substrate and electrically connected to the first electrode of the LED chip, and
- a second metallic heat conductor extending through the first heat conductor and insulated from the first heat conductor, and electrically connected to the second electrode of the LED chip; and a metallic heat dissipating member including a plurality of receiving holes receiving the first heat conductors of the respective light emitting diodes therein.

12. The light emitting diode of claim 11, wherein the first heat conductors of the light emitting diodes are threadedly engaged in the receiving holes of the heat dissipating member.

13. The light emitting diode of claim 11, wherein the first heat conductors of the light emitting diodes are electrically coupled to the heat dissipating member.

14. The light emitting diode of claim 13, further comprising a conducting layer electrically connected with the second heat conductors, a dielectric layer sandwiched between the heat dissipating member and the conducting layer, and a power supply electrically connected to the heat dissipating member and the conducting layer.

15. The light emitting diode of claim 14, wherein the conducting layer and the dielectric layer are arranged at an opposite side of the heat dissipating member to the light emitting diodes.

* * * * *